United States Patent
Sakamoto et al.

(10) Patent No.: US 10,971,331 B2
(45) Date of Patent: Apr. 6, 2021

(54) WRITING DATA GENERATION METHOD, COMPUTER-READABLE RECORDING MEDIUM ON WHICH PROGRAM IS RECORDED, AND MULTI-CHARGED PARTICLE BEAM WRITING APPARATUS

(71) Applicant: NuFlare Technology, Inc., Yokohama (JP)

(72) Inventors: Shinji Sakamoto, Yokohama (JP); Kenichi Yasui, Kawasaki (JP); Chiaki Inaba, Yokohama (JP); Hikaru Yamamura, Yokohama (JP); Satoru Fukushima, Yokohama (JP); Yoshinori Akahane, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/448,147

(22) Filed: Jun. 21, 2019

(65) Prior Publication Data
US 2020/0051782 A1    Feb. 13, 2020

(30) Foreign Application Priority Data
Jul. 18, 2018   (JP) .............................. JP2018-135232

(51) Int. Cl.
| | | |
|---|---|---|
| *H01J 37/317* | (2006.01) | |
| *H01J 37/302* | (2006.01) | |
| *H01J 37/04* | (2006.01) | |
| *H01J 37/147* | (2006.01) | |
| *H01J 37/10* | (2006.01) | |

(52) U.S. Cl.
CPC ........ *H01J 37/3177* (2013.01); *H01J 37/045* (2013.01); *H01J 37/10* (2013.01);
(Continued)

(58) Field of Classification Search
CPC ........ H01J 37/045; H01J 37/10; H01J 37/147; H01J 37/3177; H01J 2237/0435;
(Continued)

(56) References Cited

U.S. PATENT DOCUMENTS

| | | | | | |
|---|---|---|---|---|---|
| 5,581,673 A | * | 12/1996 | Kikuchi | .................. | G06T 17/20 |
| | | | | | 345/423 |
| 5,689,627 A | * | 11/1997 | Arai | ........................ | G06T 11/40 |
| | | | | | 345/423 |

(Continued)

FOREIGN PATENT DOCUMENTS

| | | |
|---|---|---|
| JP | 60-063677 | 4/1985 |
| JP | 60-198723 | 10/1985 |

(Continued)

OTHER PUBLICATIONS

Notification of Reason for Refusal dated Sep. 22, 2020 in Korean Patent Application No. 10-2019-0084281 (with English language translation), citing documents AO and AP therein, 9 pages.

*Primary Examiner* — David E Smith
(74) *Attorney, Agent, or Firm* — Oblon, McClelland, Maier & Neustadt, L.L.P.

(57) ABSTRACT

In one embodiment, a writing data generation method is for generating writing data used by a multi-charged particle beam writing apparatus. The writing data generation method includes referring to library data in which a vertex sequence including a plurality of vertices is registered, and extracting a portion of an outer line of a figure contained in design data, the portion corresponding to the vertex sequence, and representing the extracted portion by information which identifies the vertex sequence and information which indicates a connection method for the plurality of vertices of the vertex sequence, and generating the writing data.

10 Claims, 11 Drawing Sheets

(52) U.S. Cl.
CPC ........ *H01J 37/147* (2013.01); *H01J 37/3023* (2013.01); *H01J 2237/0435* (2013.01); *H01J 2237/20228* (2013.01); *H01J 2237/30488* (2013.01); *H01J 2237/31774* (2013.01)

(58) Field of Classification Search
CPC ..... H01J 2237/3023; H01J 2237/20228; H01J 2237/30488; H01J 2237/31774
See application file for complete search history.

(56) References Cited

U.S. PATENT DOCUMENTS

| | | | |
|---|---|---|---|
| 8,368,713 B2* | 2/2013 | Yamauchi | G06T 11/203 345/581 |
| 9,558,315 B2* | 1/2017 | Yasui | H01J 37/3177 |
| 2011/0226970 A1* | 9/2011 | Krecinic | G03F 7/70291 250/492.22 |
| 2016/0103945 A1 | 4/2016 | Yasui et al. | |
| 2018/0285505 A1 | 10/2018 | Hara et al. | |

FOREIGN PATENT DOCUMENTS

| | | |
|---|---|---|
| JP | 04-274575 | 9/1992 |
| JP | 07-114591 | 5/1995 |
| JP | 08-153205 | 6/1996 |
| JP | 8-263673 A | 10/1996 |
| JP | 10-261568 A | 9/1998 |
| JP | 2016-076654 | 5/2016 |
| JP | 2018-170448 | 11/2018 |

* cited by examiner

FIG. 5A

| flag_a | 00 | Right Angle |
|---|---|---|
| | 01 | Any Angle |
| | 10 | Curve |
| | 11 | Other |

FIG. 5B

| flag_b | data | | |
|---|---|---|---|
| 0 | Displace Amount $\delta$ | | |
| 1 | mirror | rot_no | ref_no |

FIG. 5C

| mirror | 0 | Inversion is applied. | |
|---|---|---|---|
| | 1 | Inversion is not applied. | |
| rot_no | 00 | 0° | |
| | 01 | 90° | |
| | 10 | 180° | |
| | 11 | 270° | |
| ref_no | Reference Number | | |

FIG. 7A  Starting Point 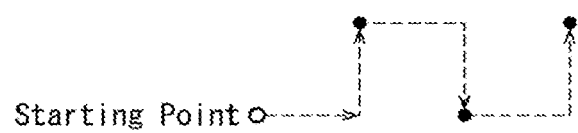
FIG. 7B  Right Angle 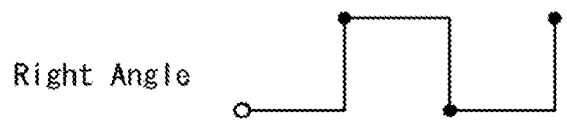
FIG. 7C  Any Angle 
FIG. 7D  Curve 

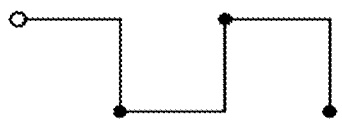
FIG. 9A
0° 
FIG. 9B
90° 
FIG. 9C
180° 
FIG. 9D
270° 

| Header | | | | |
|---|---|---|---|---|
| x0 | | | | |
| y0 | | | | |
| 5 (=N) | | | | |
| 00 | L1 | | | |
| 00 | 1 | 1 | 00 | Ref1 |
| 00 | 1 | 0 | 00 | Ref1 |
| 00 | L2 | | | |
| 00 | 0 | $\delta_{21}$ | | |
| 00 | 0 | $\delta_{22}$ | | |
| 00 | L3 | | | |
| 01 | 1 | 1 | 00 | Ref1 |
| 01 | 1 | 0 | 00 | Ref1 |
| 00 | L4 | | | |
| 00 | 0 | $\delta_{41}$ | | |
| 00 | 0 | $\delta_{42}$ | | |
| 00 | L5 | | | |
| 10 | 1 | 1 | 00 | Ref1 |
| 10 | 1 | 0 | 00 | Ref1 |

FIG. 12A
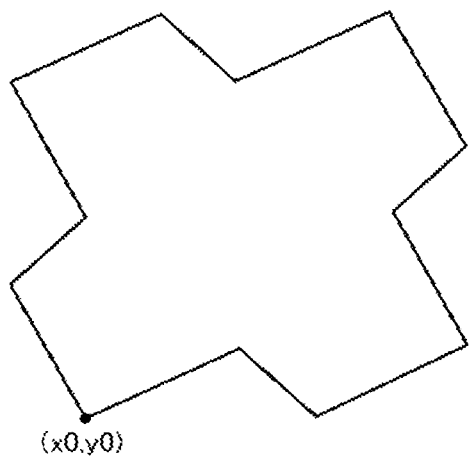
FIG. 12B
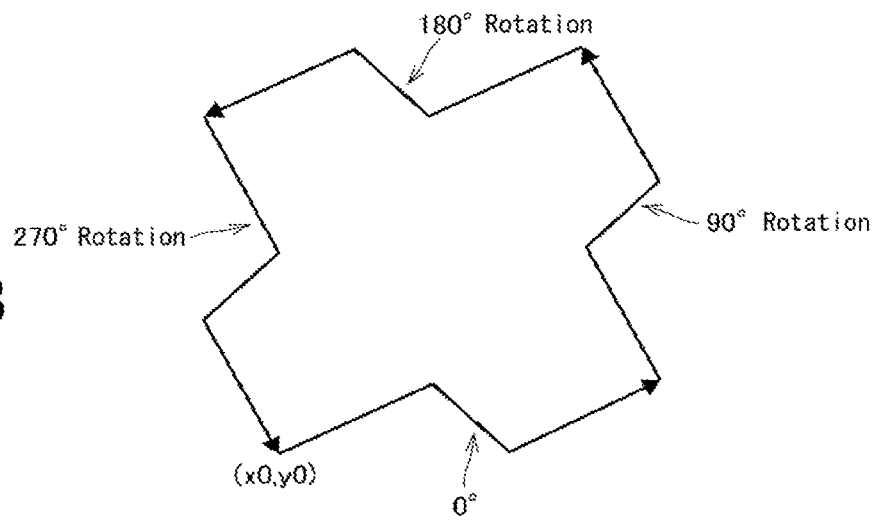
FIG. 12C
| Header | | | | |
|---|---|---|---|---|
| x0 | | | | |
| y0 | | | | |
| 4 (Line num) | | | | |
| 01 | 1 | 0 | 00 | Ref2 |
| 01 | 1 | 0 | 01 | Ref2 |
| 01 | 1 | 0 | 10 | Ref2 |
| 01 | 1 | 0 | 11 | Ref2 |
| flag_a | flag_b | mirror | rot_no | ref_no |

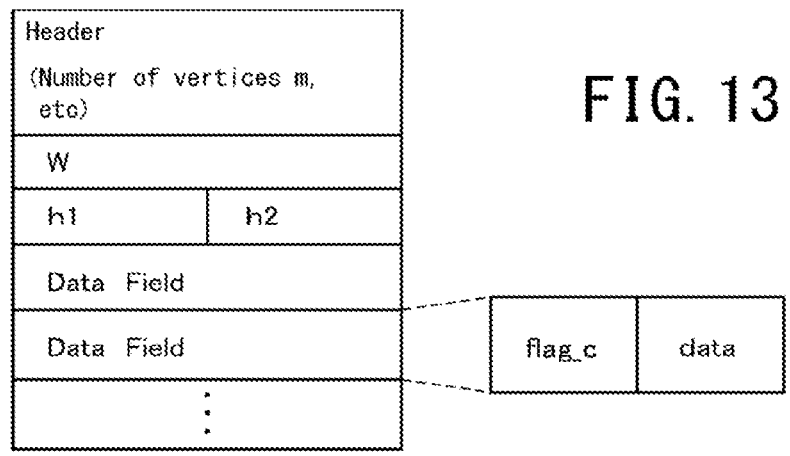

| Header | | |
|---|---|---|
| W | | |
| h1 | h2 | |
| 0 | dx1 | dy1 |
| 0 | dx2 | dy2 |
| 0 | dx3 | dy3 |

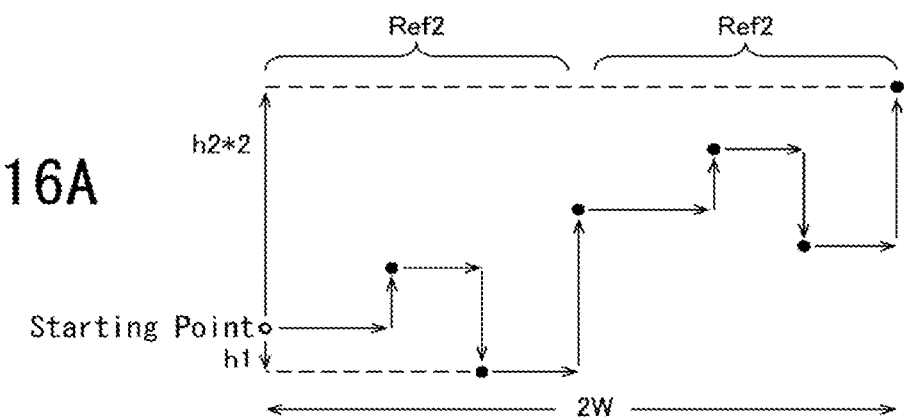

WRITING DATA GENERATION METHOD, COMPUTER-READABLE RECORDING MEDIUM ON WHICH PROGRAM IS RECORDED, AND MULTI-CHARGED PARTICLE BEAM WRITING APPARATUS

CROSS REFERENCE TO RELATED APPLICATION

This application is based upon and claims benefit of priority from the Japanese Patent Application No. 2018-135232, filed on Jul. 18, 2018, the entire contents of which are incorporated herein by reference.

FIELD

The present invention relates to a writing data generation method, a computer-readable recording medium on which program is recorded, and a multi-charged particle beam writing apparatus.

BACKGROUND

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

As an electron beam writing apparatus, a multi-beam writing apparatus with an improved throughput is known, that emits many beams at once using, for instance, a multi-beam. In the multi-beam writing apparatus, for instance, electron beams discharged from an electron gun are passed through an aperture member having multiple holes to form a multi-beam, and blanking control is performed on each beam in a blanking plate. Beams which are not blocked are reduced by an optical system, and a desired position on a writing target mask is irradiated with the beams.

When electron beam writing is performed using a multi-beam writing apparatus, first, the layout of a semiconductor integrated circuit is designed, and design data is generated as the layout data. The writing data to be inputted to the multi-beam writing apparatus is generated by dividing polygonal figures contained in the design data into multiple trapezoids. For each trapezoid, one vertex is defined as an arrangement origin, and the writing data has the coordinate data of the arrangement origin, and data indicating displacements from the arrangement origin to other three vertices.

When a figure with a curve such as an elliptical figure is contained in the design data, writing data is generated by approximating the figure with a polygon. When approximation is made with high accuracy, there is a problem in that the number of vertices and the number of figures increase, thus the data volume of the writing data becomes enormous.

BRIEF DESCRIPTION OF THE DRAWINGS

FIG. 5A is a table illustrating an example of the data structure of writing data, FIG. 5B is a table illustrating an example of the data structure of writing data, and FIG. 5C is a table illustrating an example of the data structure of writing data.

FIG. 7A illustrates an example of a vertex sequence, FIG. 7B illustrates an example of a connection method for vertices, FIG. 7C illustrates an example of a connection method for vertices, and FIG. 7D illustrates an example of a connection method for vertices.

FIG. 9A illustrates an example of rotation of a vertex sequence, FIG. 9B illustrates an example of rotation of a vertex sequence, FIG. 9C illustrates an example of rotation of a vertex sequence, and 9D illustrates an example of rotation of a vertex sequence.

FIG. 12A illustrates an example of a polygonal figure, FIG. 12B illustrates an application example of a rotated vertex sequence, and FIG. 12C illustrates an example of the data structure of writing data.

FIG. 13 is a table illustrating an example of vertex sequence data.

FIG. 14 is a table illustrating an example of the data structure of the data fields of vertex sequence data.

FIG. 16A is a diagram illustrating an example of a vertex sequence, and FIG. 16B is a table illustrating an example of vertex sequence data.

DETAILED DESCRIPTION

In one embodiment, a writing data generation method is for generating writing data used by a multi-charged particle beam writing apparatus. The writing data generation method includes referring to library data in which a vertex sequence including a plurality of vertices is registered, and extracting a portion of an outer line of a figure contained in design data, the portion corresponding to the vertex sequence, and representing the extracted portion by information which identifies the vertex sequence and information which indicates a connection method for the plurality of vertices of the vertex sequence, and generating the writing data.

An embodiment of the present invention will be described below on the basis of the drawings.

Figure 1:
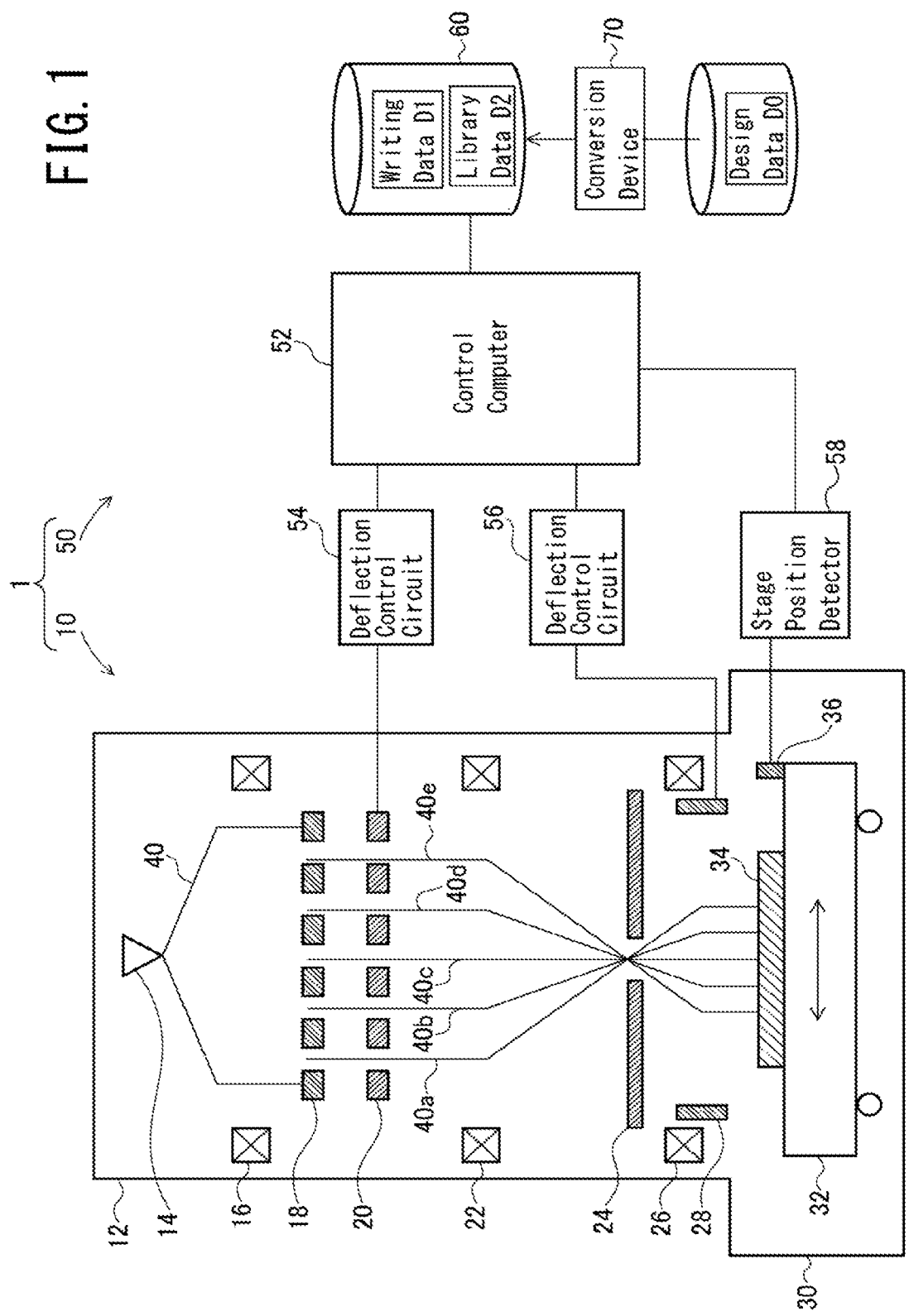
FIG. 1 is a schematic diagram of a multi-charged particle beam writing apparatus according to an embodiment of the present invention.

FIG. 1 is a schematic diagram of a multi-charged particle beam writing apparatus which performs writing using the writing data, according to the present embodiment. In the present embodiment, a configuration has been described in which an electron beam is used as an example of a charged particle beam. However, the charged particle beam is not limited to an electron beam, and may be a beam using a charged particle such as an ion beam.

A writing apparatus 1 illustrated in FIG. 1 includes a writing unit 10 that writes a desired pattern by irradiating an object, such as a mask or a wafer, with an electron beam, and a control unit 50 that controls a writing operation performed by the writing unit 10. The writing unit 10 has an electron beam column 12 and a writing chamber 30.

In the electron beam column 12, an electron gun 14, an illumination lens 16, a shaping aperture array substrate 18, a blanking plate 20, a reducing lens 22, a limiting aperture member 24, an objective lens 26, and a deflector 28 are disposed. An XY stage 32 is disposed in the writing chamber 30. A substrate 34 serving as a writing target is disposed on the XY stage 32. A writing target includes, for instance, a wafer, and a mask for exposure such as a mask blank on which a pattern is transferred using a reduced projection exposure device or an extreme ultraviolet ray exposure device such as a stepper and a scanner utilizing an excimer laser as a light source. A mirror 36 for measurement of the position of the XY stage 32 is further disposed on the XY stage 32.

The control unit 50 has a control computer 52, deflection control circuits 54, 56, and a stage position detector 58. The control computer 52, the deflection control circuits 54, 56, and the stage position detector 58 are connected to each other via a bus.

An electron beam 40 discharged from the electron gun 14 approximately perpendicularly illuminates the entire shaping aperture array substrate 18 by the illumination lens 16. In the shaping aperture array substrate 18, openings are formed in a matrix pattern with a predetermined arrangement pitch. The electron beam 40 illuminates an area which includes all the openings of the shaping aperture array substrate 18. Multi-beams 40a to 40e as illustrated in FIG. 1 are formed by part of the electron beam 40 passing through these multiple openings.

In the blanking plate 20, a passage hole is formed according to the disposition position of each opening of the shaping aperture array substrate 18. A blanker consisting of two electrodes forming a pair is disposed at each passage hole. The electron beams 40a to 40e which pass through respective passage holes are each independently deflected by a voltage applied by a corresponding blanker. Blanking control is performed by such deflection. In this manner, multiple blankers perform blanking deflection of corresponding beams among multi-beams which have passed through multiple openings of the shaping aperture array substrate 18.

The multi-beams 40a to 40e, which have passed through the blanking plate 20, are reduced by the reducing lens 22, and travel towards a central hole formed in the limiting aperture member 24. An electron beam deflected by a blanker of the blanking plate 20 is displaced from the position the central hole of the limiting aperture member 24, and is blocked by the limiting aperture member 24. In contrast, an electron beam not deflected by a blanker of the blanking plate 20 passes through the central hole of the limiting aperture member 24.

In this manner, the limiting aperture member 24 blocks each beam deflected by a blanker of the blanking plate 20 so as to achieve a beam OFF state. The beam, which has passed through the limiting aperture member 24 in a period from beam ON until beam OFF is achieved, forms one-shot beam. The multi-beams 40a to 40e, which have passed through the limiting aperture member 24, are focused by the objective lens 26 to form a pattern image having a desired reduction ratio. The beams (entire multi-beam), which have passed through the limiting aperture member 24, are collectively deflected in the same direction by the deflector 28, and are radiated to respective irradiation positions on the substrate 34.

Multi-beams irradiated at once are ideally arranged at a pitch which is obtained by multiplying the arrangement pitch of the multiple openings of the shaping aperture array substrate 18 by the above-mentioned desired reduction rate. The writing apparatus performs a writing operation by a raster scan system that sequentially irradiates with shot beams continuously, and when a desired pattern is written, a necessary beam according to the pattern is controlled to be beam ON by the blanking control. When the XY stage 32 is continuously moved, the irradiation position of each beam is controlled by the deflector 28 so that the irradiation position follows the movement of the XY stage 32. The XY stage 32 is moved by a stage control unit which is not illustrated, and the position of the XY stage 32 is detected by stage position detector 58.

The control computer 52 reads writing data D1 and library data D2 from a storage device 60, and performs data conversion processing in multiple stages to generate shot data specific to the device. The writing data D1 and the library data D2 will be described later. The amount of irradiation and the coordinates of the irradiation position of each shot are defined in the shot data. For instance, the control computer 52 assigns a figure pattern defined in the writing data to corresponding pixels. The control computer 52 calculates an area density of a figure pattern disposed for each pixel.

For each pixel, the control computer 52 calculates the amount of irradiation of electron beam per one shot. For instance, the irradiation amount proportional to the area density of a pixel is determined, and the irradiation amount is corrected in consideration of a dimensional variation caused by a proximity effect, a foggy effect, a loading effect and the like.

The control computer 52 outputs the amount of irradiation of each shot to the deflection control circuit 54 based on the shot data. The deflection control circuit 54 determines an irradiation time t by dividing an inputted amount of irradiation by a current density. When a shot is performed, the deflection control circuit 54 applies a deflection voltage to a corresponding blanker of the blanking plate 20 only for the irradiation time t so as to achieve beam ON of the blanker.

In addition, the control computer 52 outputs deflection position data to the deflection control circuit 56 so that each beam is deflected to the position (coordinates) indicated by the shot data. The deflection control circuit 56 calculates an amount of deflection, and applies a deflection voltage to the deflector 28. Thus, the multi-beams to be shot that time are collectively deflected.

Next, the writing data D1 and the library data D2 will be described. First, the layout of a semiconductor integrated circuit is designed, and design data (CAD data) D0 used as layout data is generated. The design data D0 is converted by a conversion device 70, and the writing data D1 to be inputted to the control computer 52 of the writing apparatus 1 is generated. The library data D2 is prepared in advance, and is stored in the storage device 60.

Figure 2A:
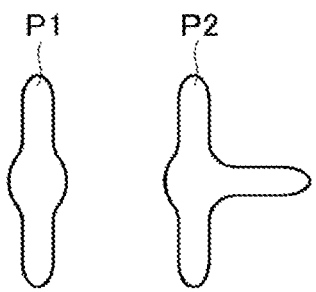
FIG. 2A illustrates an example of a figure with a curve.

A pattern for correction is added to the figure of the design data D0 by processing such as OPC (optical proximity correction). Thus, a figure with a curve is contained in the design data D0. For instance, figures P1, P2 each having curves as illustrated in FIG. 2A are included. Although such figures can each be approximated by a polygonal figure and writing data can be generated by dividing the polygonal figure into multiple elongated trapezoids, when approximation is made with high accuracy, the number of vertices of the polygonal figure increases, the number of dividing trapezoids increases, and thus the data volume of the writing data becomes enormous.

Although the figures in the design data D0 have various shapes, when attention is paid to a portion of the shapes, similar shapes are found in many cases. In the present embodiment, multiple shapes serving as reference shapes are prepared in advance, and each figure in the design data D0 is represented by a combination of the reference shapes. The reference shapes are each represented by multiple vertices, and referred to as a "vertex sequence" in the embodiment below.

Figure 2B:
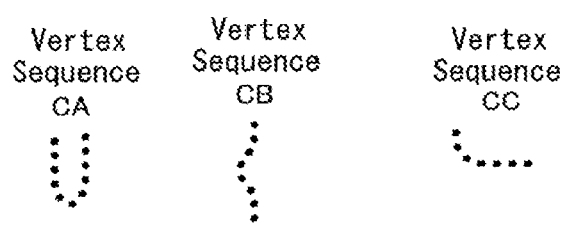
FIG. 2B illustrates an example of a vertex sequence.
Figure 2C:
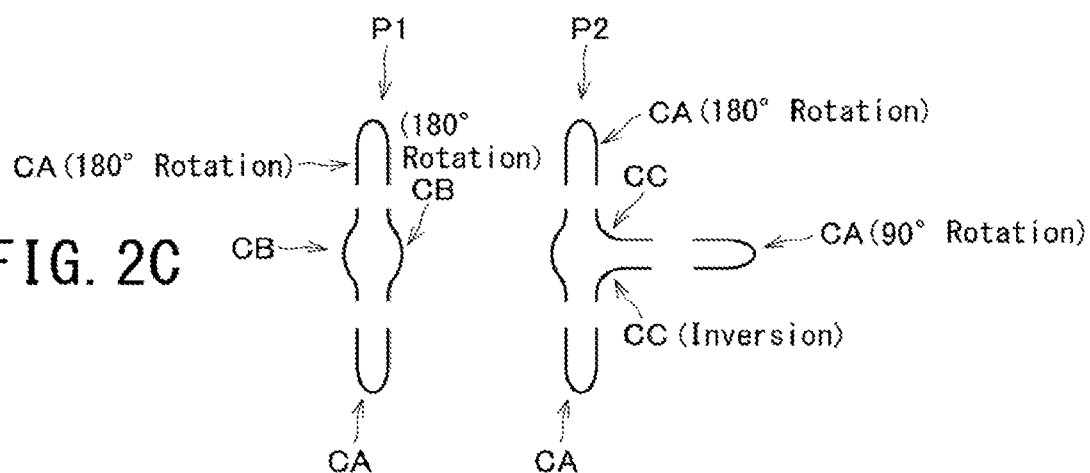
FIG. 2C illustrates an example of representation of a figure.

For instance, a vertex sequence CA, CB, and CC as illustrated in FIG. 2B is prepared. As illustrated in FIG. 2C, the figure P1 illustrated in FIG. 2A can be represented by connecting a vertex sequence CA, a vertex sequence CA which is rotated 180°, a vertex sequence CB, and a vertex sequence CB which is rotated 180° using curves.

As illustrated in FIG. 2C, the figure P2 illustrated in FIG. 2A can be represented by connecting a vertex sequence CA, a vertex sequence CA which is rotated 90°, a vertex sequence CA which is rotated 180°, a vertex sequence CB, a vertex sequence CC, and an inverted vertex sequence CC using curves.

In this manner, the figures P1, P2 can be represented with the three types of vertex sequences CA, CB, CC by utilizing rotation and inversion of the vertex sequences.

Various vertex sequences are registered in the library data D2. The conversion device 70 refers to the library data D2, extracts portions corresponding to vertex sequences from the outer line (peripheral edge) of a figure, and represents the extracted portions by information which identifies each vertex sequence, and information which shows a connection method for vertices included in the vertex sequence, thereby generating writing data D1.

Figures 3, 4:
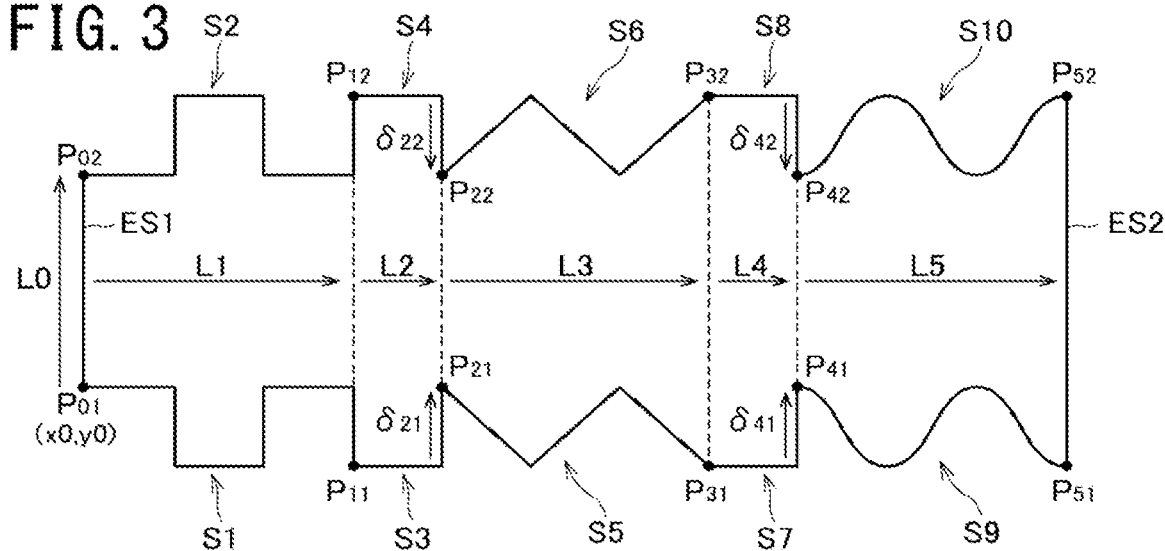
FIG. 3 is a diagram illustrating an example of processing of dividing a figure.
FIG. 4 is a table illustrating an example of the data structure of writing data.

FIG. 3 illustrates an example of a figure with curves and zigzag lines. The figure is surrounded by a pair of linear edge sides ES1, ES2 parallel in a first direction (Y direction), a line segment that connects the lower ends of the edge sides ES1 and ES2, and a line segment that connects the upper ends of the edge sides ES1 and ES2. The line segment that connects the lower ends of the edge sides ES1 and ES2, and the line segment that connects the upper ends of the edge sides ES1 and ES2 include curves and different line segments of zigzag-shape type.

The conversion device 70 extracts a portion of the sides of a figure, which can be represented by predetermined vertex sequences registered in the library data D2, and divides the figure using the extracted portion. The division lines of the figure are along the first direction.

For instance, side S1 from vertex $P_{01}$ at the lower end of the side ES1 to vertex $P_{11}$, and side S2 from vertex $P_{02}$ at the upper end of the side ES1 to vertex $P_{12}$ can be represented by predetermined vertex sequences. Let L1 be the displacement from vertex $P_{01}$ to the vertex $P_{11}$ (from the vertex $P_{02}$ to the vertex $P_{12}$) in a second direction.

There is no corresponding vertex sequence for side S3 from the vertex $P_{11}$ to vertex $P_{21}$, and side S4 from the vertex $P_{12}$ to vertex $P_{22}$, thus the sides S3 and S4 are represented by the sides with right angle type, $\delta_{21}$, $\delta_{22}$ as the displacement in the first direction, and L2 as the displacement in the second direction.

Side S5 from the vertex $P_{21}$ to vertex $P_{31}$, and side S6 from vertex $P_{22}$ to vertex $P_{32}$ can be represented by predetermined vertex sequences. Let L3 be the displacement from the vertex $P_{21}$ to the vertex $P_{31}$ (from the vertex $P_{22}$ to the vertex $P_{32}$) in the second direction.

There is no corresponding vertex sequence for side S7 from the vertex $P_{31}$ to vertex $P_{41}$, and side S8 from the vertex $P_{32}$ to vertex $P_{42}$, thus the sides S7 and S8 are represented by the sides with right angle type, $\delta_{41}$, $\delta_{42}$ as the displacement in the first direction, and L4 as the displacement in the second direction.

Side S9 from the vertex $P_{41}$ to vertex $P_{51}$, and side S10 from the vertex $P_{42}$ to vertex $P_{52}$ can be represented by predetermined vertex sequences. Let L5 be the displacement from the vertex $P_{41}$ to the vertex $P_{51}$ (from the vertex $P_{42}$ to the vertex $P_{52}$) in the second direction.

FIG. 4 illustrates an example of the data structure of the writing data D1 that defines a figure. For instance, the data size of the writing data D1 representing a figure is registered in the header. Subsequently to the header, the coordinates (x0, y0) of vertex $P_{01}$ at the lower end of the side ES1 is registered, the vertex $P_{01}$ being the origin of figure arrangement position. Subsequently, length L0 of the side ES1 is registered. The position of the vertex $P_{02}$ at the upper end of the side ES1 is determined from the coordinates of $P_{01}$ of the origin of figure arrangement position, and the length L0.

Subsequently, division number N of the figure is registered.

Subsequently, information on the width of a divided figure in the second direction and the upper and lower sides is sequentially registered from the side of the origin of figure arrangement position. For instance, first, width L1 of the first divided figure in the second direction, and flag1 are registered. The flag1 is a two-bit value that indicates information on which one of the upper and lower sides of the divided figure is registered. When the flag1 is 00, this indicates that information on both the upper and lower sides is subsequently registered. When the flag1 is 01, this indicates that both the upper and lower sides are flat, there is no displacement in the second direction, thus no information on the upper and lower sides is registered. When the flag1 is 10, this indicates that information on the lower side is subsequently registered, the upper side is flat, thus no information on the upper side is registered. When the flag1 is 11, this indicates that information on the upper side is subsequently registered, the lower side is flat, thus no information on the lower side is registered.

A data field (DataField) indicates information on each side. The DataField includes flag_a, flag_b, and data. As illustrated in FIG. 5A, flag_a is a two-bit value that indicates a type of connection between vertices. The flag_a of 00 indicates a right angle type, the flag_a of 01 indicates any angle type, and the flag_a of 10 indicates a curve type.

As illustrated in FIG. 5B, the flag_b is a one-bit value. When the flag_b is 0, this indicates that the library data D2 is not referred to, and the displacement amount δ in the first direction is registered in the subsequent data. When the flag_b is 1, this indicates that the library data D2 is referred to, and library reference information is registered in the subsequent data. In other words, when the flag_b is 1, this indicates that the sides are represented using vertex sequences registered in the library data D2.

The library reference information includes mirror, rot_no, and ref_no. As illustrated in FIG. 5C, the mirror is a one-bit value that indicates whether or not inversion is applied to a vertex sequence. The rot_no is a two-bit value that indicates a rotational angle of a vertex sequence. The rot_no of 00 indicates no rotation, the rot_no of 01 indicates 90° rotation, the rot_no of 10 indicates 180° rotation, and the rot_no of 11 indicates 270° rotation.

The ref_no is a reference number of a vertex sequence registered in the library data D2. The reference number indicates which vertex sequence has been utilized.

Figure 6A:
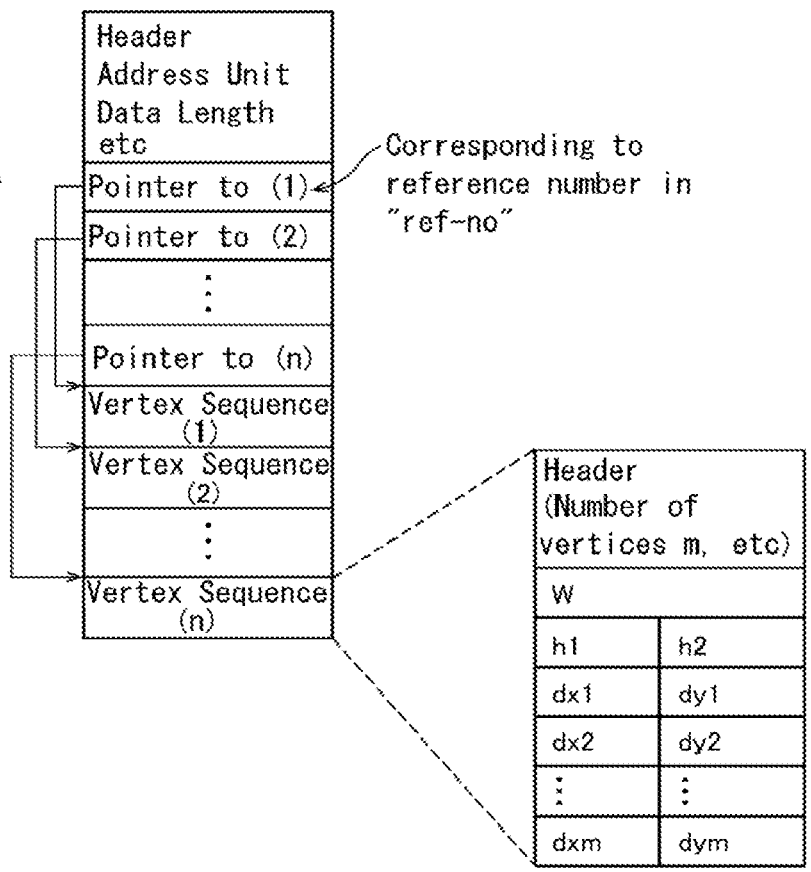
FIG. 6A is a table illustrating an example of the data structure of library data.
Figure 6B:
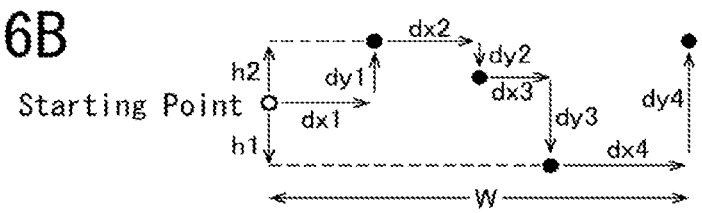
FIG. 6B is a diagram illustrating an example of a vertex sequence.

FIG. 6A illustrates an example of the data structure of the library data D2, and FIG. 6B is an image diagram of a vertex sequence. A starting point or relative coordinates from the previous point is registered in vertex sequence data. In addition, displacement w from the starting point to the last vertex in X direction, and maximum displacements h1, h2 in −Y direction, +Y direction as viewed from the starting point are registered in the vertex sequence data. It is possible to determine the circumscribed rectangle easily using the displacements w, h1, and h2.

When the vertex sequence as illustrated in FIG. 7A is connected by a line segment of right angle type, the connected vertex sequence is as shown in FIG. 7B. When the vertex sequence is connected by a line segment of any angle type, the connected vertex sequence is as shown in FIG. 7C. When the vertex sequence is connected by a line segment of curve type, the connected vertex sequence is as shown in FIG. 7D. Even when the same vertex sequence is used, a different shape can be represented by changing the value of flag_a indicating a connection type.

Figure 8:
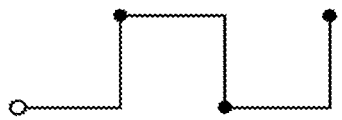
FIG. 8 illustrates an example of inversion of a vertex sequence.

FIG. 8 illustrates an example of inversion of a vertex sequence. In FIG. 8, vertices are connected by a line segment of right angle type.

FIGS. 9A to 9D each illustrate an example of rotation of a vertex sequence. In FIGS. 9A to 9D, vertices are connected by a line segment of any angle type.

Figures 10, 11:
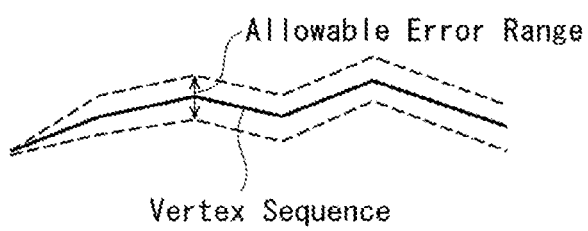
FIG. 10 is a table illustrating an example of the data structure of writing data.
FIG. 11 illustrates an example of an allowable error range.

FIG. 10 illustrates an example of the writing data D1 that represents the figure illustrated in FIG. 3. Since the figure illustrated in FIG. 3 is divided into five parts, 5 is registered as the division number N.

For the first divided figure, information on both the upper and lower sides S1, S2 is registered, thus the flag1 is 00, and the displacement in X direction is L1. Since the sides S1, S2 are of right angle type and a vertex sequence in the library data D2 can be used, the flag_a is 00, and the flag_b is 1. The side S2 is obtained by connecting a vertex sequence having a reference number Ref1 by a line segment of right angle type, and the side S1 is obtained by connecting an inverted vertex sequence having the same reference number Ref1 by a line segment of right angle type. Therefore, for the side S1, mirror is 1, rot_no is 00, and ref_no is Ref1. For the side S2, mirror is 0, rot_no is 00, and ref_no is Ref1.

For the second divided figure, information on both the upper and lower sides S3, S4 is registered, thus the flag1 is 00. Since the sides S3, S4 are of right angle type and a vertex sequence in the library data D2 is not used, the flag_a is 00, and the flag_b is 0. Displacement amounts $\delta_{21}$, $\delta_{22}$ in the first direction are registered in the data.

For the third divided figure, information on both the upper and lower sides S5, S6 is registered, thus the flag1 is 00. Since the sides S5, S6 are of any angle type and a vertex sequence in the library data D2 can be used, the flag_1 is 01, and the flag_b is 1. The side S6 is obtained by connecting a vertex sequence having the reference number Ref1 by a line segment of any angle type, and the side S5 is obtained by connecting an inverted vertex sequence having the same reference number Ref1 by a line segment of any angle type. Therefore, for the side S5, mirror is 1, rot_no is 00, and ref_no is Ref1. For the side S6, minor is 0, rot_no is 00, and ref_no is Ref1.

For the fourth divided figure, information on both the upper and lower sides S7, S8 is registered, thus the flag1 is 00. Since the sides S7, S8 are of right angle type and a vertex sequence in the library data D2 is not used, the flag_a is 00, and the flag_b is 0. Displacement amounts $\delta_{41}$, $\delta_{42}$ in the first direction are registered in the data.

For the fifth divided figure, information on both the upper and lower sides S9, S10 is registered, thus the flag1 is 00. Since the sides S9, S10 are of curve type and a vertex sequence in the library data D2 can be used, the flag_a is 10, and the flag_b is 1. The side S10 is obtained by connecting a vertex sequence having the reference number Ref1 by a line segment of curve type, and the side S9 is obtained by connecting an inverted vertex sequence having the same reference number Ref1 by a line segment of curve type. Therefore, for the side S9, mirror is 1, rot_no is 00, and ref_no is Ref1. For the side S10, mirror is 0, rot_no is 00, and ref_no is Ref1.

In this manner, in the present embodiment, vertex sequences registered in the library data D2 are referred to, the outer lines of figures such as curves and zigzag shapes in the design data D0 are represented by information which designates (identifies) the vertex sequences, and information which indicates a connection method for the vertices of the vertex sequences, and thus the writing data D1 with a reduced data volume is generated. Thus, processing time such as a data transfer time for the writing data D1 transferred to the control computer 52, and a data read time for the writing data D1 read in the control computer 52 can be reduced.

The control computer 52 reads the writing data D1 and the library data D2, and reconstructs a figure. For instance, the control computer 52 calculates the position of vertex $P_{O1}$ from the coordinates (x0, y0) of the writing data D1, the vertex $P_{O1}$ being the origin of figure arrangement position. Subsequently, the position of the vertex $P_{O2}$ at the upper end of the edge side ES1 is calculated using the length L0.

The vertex sequence having the reference number Ref1 is retrieved from the library data D2, the vertex sequence is inverted, the vertices are connected by a line segment of right angle type, and thus the side S1 from the vertex $P_{O1}$ to the vertex PH is determined. The side S2 from the vertex $P_{O2}$ to the vertex $P_{12}$ is determined by connecting the vertices of the vertex sequence by a line segment of right angle type. Hereinafter, the upper and lower sides of the adjacent division figure are sequentially calculated. Thus, figures having curves and zigzag lines are reconstructed, and the control unit 50 controls the writing unit 10 and performs writing based on the reconstructed figures.

In this manner, vertex sequences in the library data D2 are referred to, and data processing of the writing data D1 which represents the sides of figures is easily performed by the control computer 52 of the writing apparatus 1.

The library data D2 may include allowable error information. The allowable error information indicates the allowable error range as illustrated in FIG. 11. When the outer line of a figure in the design data D0 is included in the allowable error range with reference to a vertex sequence, the conversion device 70 treats the figure as the same vertex sequence.

The polygonal figure as illustrated in FIG. 12A can be represented with less data volume using the same vertex sequence by changing a rotation angle as illustrated in FIG. 12B. FIG. 12C illustrates an example of writing data that represents the polygonal figure.

The library data D2 may be included in the writing data D1.

The vertex sequences registered in the library data D2 may be prepared in advance or may be extracted from part of the figures in the design data D0.

The vertex sequences registered in the library data D2 may be configured to refer to other vertex sequences. This is preferable, for instance, when a second vertex sequence in which multiple first vertex sequences are connected is represented.

In this case, as illustrated in FIG. 13, header information, displacement w from the starting point to the last vertex in X direction, maximum displacements h1, h2 in −Y direction, +Y direction as viewed from the starting point, and data fields (DataField) are registered in the vertex sequence data. The DataField includes flag_c and data.

As illustrated in FIG. 14, the flag_c is a one-bit value. When the flag_c is 0, this indicates that other vertex sequence data is not referred to, and relative coordinates dxn, dyn from the previous point are registered in the subsequent data. When the flag_c is 1, this indicates that other vertex sequence data is referred to, and library reference information is registered in the subsequent data.

Similarly to FIG. 5C, the library reference information includes mirror, rot_no, and ref_no.

Figures 15A, 15B:
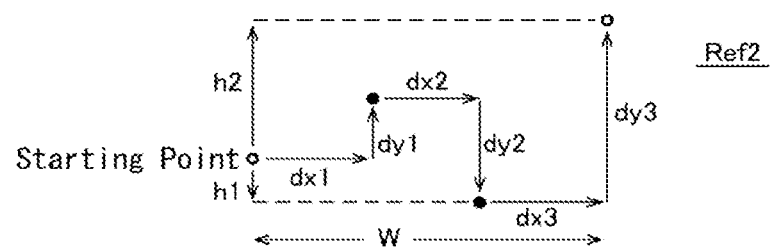
FIG. 15A is a diagram illustrating an example of a vertex sequence.
FIG. 15B is a table illustrating an example of vertex sequence data.

For instance, the vertex sequence data of the vertex sequence illustrated in FIG. 15A is as shown in FIG. 15B. Specifically, for each vertex, data fields including flag_c=0, and relative coordinates from the previous point are registered. Let Ref2 be the reference number of the vertex sequence.

The vertex sequence illustrated in FIG. 16A is obtained by connecting two vertex sequences having the reference number Ref2. The vertex sequence data of the vertex sequence is as shown in FIG. 16B. Specifically, two data fields, in which flag_c=1, mirror=0, rot_no=00, and ref_no=Ref2, are registered. Since it is not necessary to register relative coordinates from the previous point for each vertex, the data volume of the library data D2 can be reduced.

Although examples have been described in which a vertex sequence is inverted or rotated in the embodiment, a vertex sequence may be expanded or contracted.

At least part of the conversion device 70 which generates the writing data D1 described in the above embodiments may be implemented in either hardware or software. When implemented in software, a program that realizes at least part of functions of the conversion device 70 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

The program that realizes at least part of the functions of the conversion device 70 may be distributed through a communication line (including wireless communications) such as the Internet. Further, the program may be encrypted, modulated, or compressed to be distributed through a wired line or wireless line such as the Internet or to be distributed by storing the program on a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing method comprising:
    referring to library data in which a vertex sequence including a plurality of vertices is registered;
    extracting a portion of an outer line of a figure contained in design data, the portion corresponding to the vertex sequence;
    representing the extracted portion by information which identifies the vertex sequence and information which indicates a connection method for the plurality of vertices of the vertex sequence;
    generating writing data based upon the information which identifies the vertex sequence and the information which indicates the connection method for the plurality of vertices of the vertex sequence; and
    controlling a charged particle beam writing apparatus using the writing data to write a pattern by irradiating a substrate with the charged particle beam wherein the connection method describes a line segment shape, angle or direction.

2. The method according to claim 1, wherein
    a portion of the outer line of the figure is extracted, the portion corresponding to the vertex sequence which is rotated, inverted, expanded, or contracted,
    the extracted portion is represented by information which identifies the vertex sequence, information which indicates the connection method for the plurality of vertices of the vertex sequence, and information on rotation, inversion, expansion, or contraction of the vertex sequence, and
    the writing data is generated based upon the information which identifies the vertex sequence, the information which indicates the connection method for the plurality of vertices of the vertex sequence, and the information on rotation, inversion, expansion, or contraction of the vertex sequence.

3. The method according to claim 1, wherein
    the library data includes allowable error information that indicates an allowable error range, and
    a portion of the outer line of the figure is extracted, the portion being included in the allowable error range based on the vertex sequence.

4. The method according to claim 1, wherein part of the figure contained in the design data is utilized as the vertex sequence.

5. The method according to claim 1, wherein a displacement from a starting point to a last vertex of the vertex sequence in a first direction, and a greatest displacement in a second direction perpendicular to the first direction as viewed from the starting point are registered in the library data.

6. A non-transitory computer readable recording medium storing a program causing a computer to execute a process for generating writing data used by a charged particle beam writing apparatus, the process comprising:
    referring to library data, by the program, in which a vertex sequence including a plurality of vertices is registered;
    extracting a portion of an outer line of a figure contained in design data, the portion corresponding to the vertex sequence;
    representing the extracted portion by information which identifies the vertex sequence and information which indicates a connection method for the plurality of vertices of the vertex sequence; and
    generating writing data based upon the information which identifies the vertex sequence and the information which indicates the connection method for the plurality of vertices of the vertex sequence wherein the connection method describes a line segment shape, angle or direction.

7. The non-transitory computer readable recording medium according to claim 6, wherein the program causes the computer to execute a process comprising:
- extracting a portion of the outer line of the figure, the portion corresponding to the vertex sequence which is rotated, inverted, expanded, or contracted;
- representing the extracted portion by information which identifies the vertex sequence, information which indicates the connection method for the plurality of vertices of the vertex sequence, and information on rotation, inversion, expansion, or contraction of the vertex sequence; and
- generating the writing data based upon the information which identifies the vertex sequence, the information which indicates the connection method for the plurality of vertices of the vertex sequence, and the information on rotation, inversion, expansion, or contraction of the vertex sequence.

8. The non-transitory computer readable recording medium according to claim 6, wherein
- the library data includes allowable error information that indicates an allowable error range, and
- the program causes the computer to execute extracting a portion of the outer line of the figure, the portion being included in the allowable error range with reference to the vertex sequence.

9. The non-transitory computer readable recording medium according to claim 6, wherein the program causes the computer to utilize part of the figure contained in the design data as the vertex sequence.

10. A charged particle beam writing apparatus comprising:
- a writing unit configured to:
    - write a pattern by irradiating a substrate with a charged particle beam; and
- a control unit configured to:
    - receive an input of writing data in which an outer line of a figure contained in design data is represented by information which designates one of a plurality of vertex sequences registered in library data, each of which includes a plurality of vertices, and by information which indicates a connection method for the plurality of vertices of the designated vertex sequence,
    - retrieve the vertex sequence designated in the writing data from the library data,
    - reconstruct the figure by connecting the vertices of the retrieved vertex sequence based on the information which indicates the connection method, and
    - control the writing unit based on the reconstructed figure wherein the connection method describes a line segment shape, angle or direction.

* * * * *